US009159570B2

(12) United States Patent
Kim et al.

(10) Patent No.: US 9,159,570 B2
(45) Date of Patent: Oct. 13, 2015

(54) NON-VOLATILE MEMORY DEVICE AND METHOD FOR FABRICATING THE SAME

(71) Applicant: SK hynix Inc., Gyeonggi-do (KR)

(72) Inventors: Min-Soo Kim, Gyeonggi-do (KR); Dong-Sun Sheen, Gyeonggi-do (KR); Seung-Ho Pyi, Gyeonggi-do (KR); Sung-Jin Whang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/569,035

(22) Filed: Dec. 12, 2014

(65) Prior Publication Data

US 2015/0099339 A1 Apr. 9, 2015

Related U.S. Application Data

(62) Division of application No. 13/618,182, filed on Sep. 14, 2012, now Pat. No. 8,928,063.

(30) Foreign Application Priority Data

Dec. 22, 2011 (KR) ........................ 10-2011-0140533

(51) Int. Cl.

*H01L 21/28* (2006.01)
*H01L 27/115* (2006.01)
*H01L 29/792* (2006.01)
*H01L 29/66* (2006.01)

(52) U.S. Cl.

CPC .... *H01L 21/28282* (2013.01); *H01L 27/11582* (2013.01); *H01L 29/792* (2013.01); *H01L 29/66666* (2013.01); *H01L 29/66833* (2013.01)

(58) Field of Classification Search

CPC .................. H01L 21/28282; H01L 27/11582; H01L 29/66666; H01L 29/66833; H01L 29/792

See application file for complete search history.

(56) References Cited

U.S. PATENT DOCUMENTS

| | | | | |
|---|---|---|---|---|
| 7,847,334 | B2 * | 12/2010 | Katsumata et al. | 257/315 |
| 2009/0108333 | A1 * | 4/2009 | Kito et al. | 257/324 |
| 2012/0001249 | A1 * | 1/2012 | Alsmeier et al. | 257/319 |
| 2012/0012920 | A1 * | 1/2012 | Shin et al. | 257/324 |
| 2012/0049268 | A1 * | 3/2012 | Chang et al. | 257/324 |
| 2012/0098051 | A1 * | 4/2012 | Son et al. | 257/324 |
| 2012/0139027 | A1 * | 6/2012 | Son et al. | 257/324 |
| 2012/0146122 | A1 * | 6/2012 | Whang et al. | 257/315 |

* cited by examiner

*Primary Examiner* — Michael Lebentritt
*Assistant Examiner* — Jordan Klein
(74) *Attorney, Agent, or Firm* — IP & T Group LLP

(57) ABSTRACT

A non-volatile memory device includes a channel layer vertically extending from a substrate, a plurality of inter-layer dielectric layers and a plurality of gate electrodes that are alternately stacked along the channel layer, and an air gap interposed between the channel layer and each of the plurality of gate electrodes. The non-volatile memory device may improve erase operation characteristics by suppressing back tunneling of electrons by substituting a charge blocking layer interposed between a gate electrode and a charge storage layer with an air gap, and a method for fabricating the non-volatile memory device.

8 Claims, 16 Drawing Sheets

T 140A 145 150 155 H1
160A
165A
170
175
120A
120A
120A
120A
120A
100

NON-VOLATILE MEMORY DEVICE AND METHOD FOR FABRICATING THE SAME

CROSS-REFERENCE TO RELATED APPLICATIONS

This application is a division of U.S. patent application Ser. No. 13/618,182 filed on Sep. 14, 2012, which claims priority of Korean Patent Application No. 10-2011-0140533, filed on Dec. 22, 2011. The disclosure of each of the foregoing applications is incorporated herein by reference in its entirety.

BACKGROUND

1. Field

Exemplary embodiments of the present invention relate to a non-volatile memory device and a fabrication method thereof, and more particularly, to a non-volatile memory device having a three-dimensional structure where a plurality of memory cells are stacked vertically from a substrate, and a method for fabricating the non-volatile memory device.

2. Description of the Related Art

Non-volatile memory devices retain data although power is turned off. Currently, various nonvolatile memory devices, such as a flash memory, have been widely used.

As the integration degree of a non-volatile memory device having a two-dimensional structure where memory cells are formed in a single layer may reach a limit, a non-volatile memory device having a three-dimensional structure where a plurality of memory cells are formed along the channels that are extend vertically from a semiconductor substrate have been suggested. More specifically, non-volatile memory devices having a three-dimensional structure are divided into devices having a linear channel layers and devices having U-shaped channel layers.

A charge-trapping-type non-volatile memory device generally includes a memory layer between a channel layer and a gate electrode, and the memory layer includes a charge blocking layer, a charge storage layer, and a channel insulation layer. However, erase operation characteristics of a charge-trapping-type non-volatile memory device are deteriorated due to back tunneling that occurs as the electrons are introduced to the charge storage layer through the charge blocking layer when a memory cell performs an erase operation.

To address this back tunneling, a method of forming the charge blocking layer thick or a method of using a high dielectric layer is suggested. However, preventing the charges from being introduced from the charge blocking layer to the charge storage layer may be difficult, and the size of the non-volatile memory device may be increased.

SUMMARY

An embodiment of the present invention is directed to a non-volatile memory device that may improve erase operation characteristics by suppressing back tunneling of electrons by substituting a charge blocking layer interposed between a gate electrode and a charge storage layer with an air gap, and a method for fabricating the non-volatile memory device.

In accordance with an embodiment of the present invention, a non-volatile memory device includes: a channel layer vertically extending from a substrate; a plurality of inter-layer dielectric layers and a plurality of gate electrodes that are alternately stacked along the channel layer; and an air gap interposed between the channel layer and each of the plurality of gate electrodes.

In accordance with another embodiment of the present invention, a method for fabricating a non-volatile memory device includes: alternately stacking a plurality of inter-layer dielectric layers and a plurality of first and second sacrificial layers over a substrate; forming channel holes that expose the substrate by selectively etching the inter-layer dielectric layers and the first and second sacrificial layers; sequentially forming a charge blocking layer, a charge storage layer, a tunnel insulation layer, and a channel layer along internal walls of the channel holes; forming slit holes through the first and second sacrificial layers and the inter-layer dielectric layers on both sides of each channel hole; removing the first sacrificial layers exposed through the slit holes; forming a first gate electrode layer pattern in a space created by removing the first sacrificial layers; removing the second sacrificial layers; and forming a second gate electrode layer for coupling a pair of the first gate electrode layer patterns with each other with the air gap formed between the pair of first gate electrode layer patterns, wherein the air gap is formed by removing the second sacrificial layers.

DETAILED DESCRIPTION

Figure 1A:
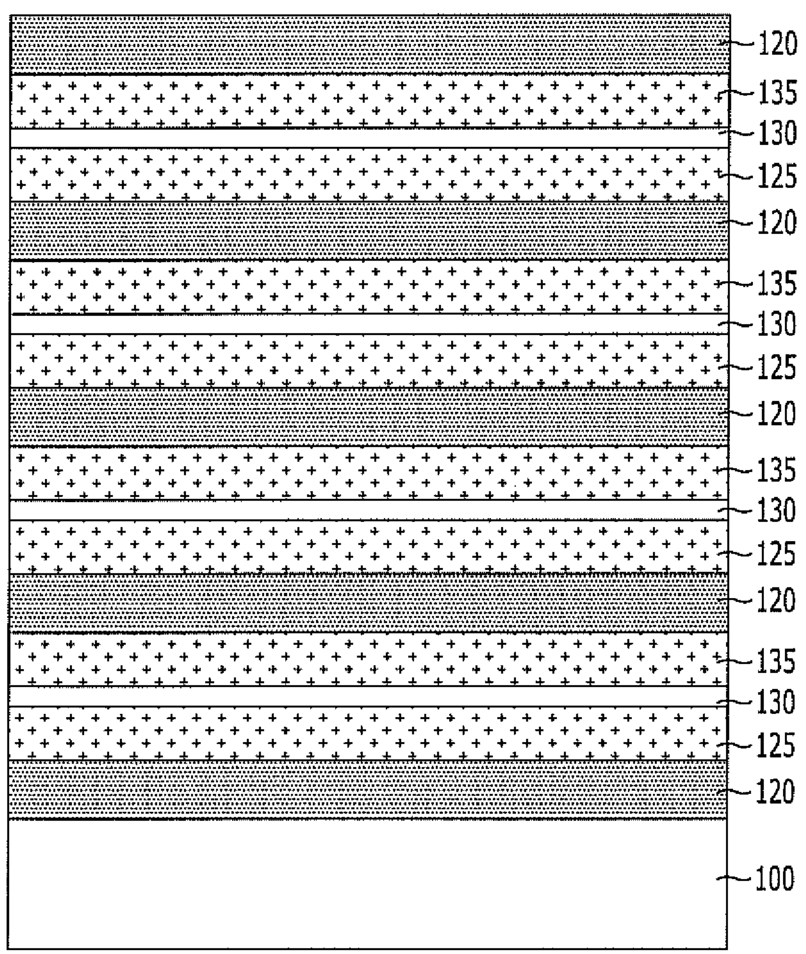
FIGS. 1A to 1G are cross-sectional views illustrating a non-volatile memory device and a fabrication method thereof in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1B:
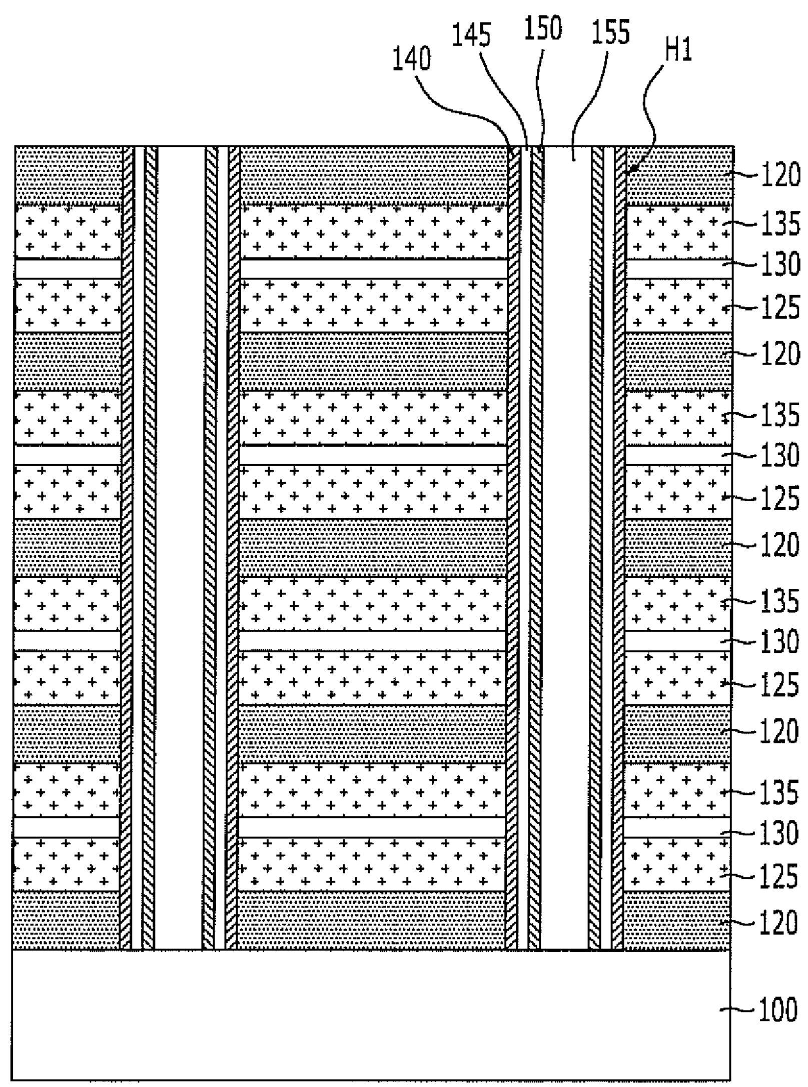
Figure 1C:
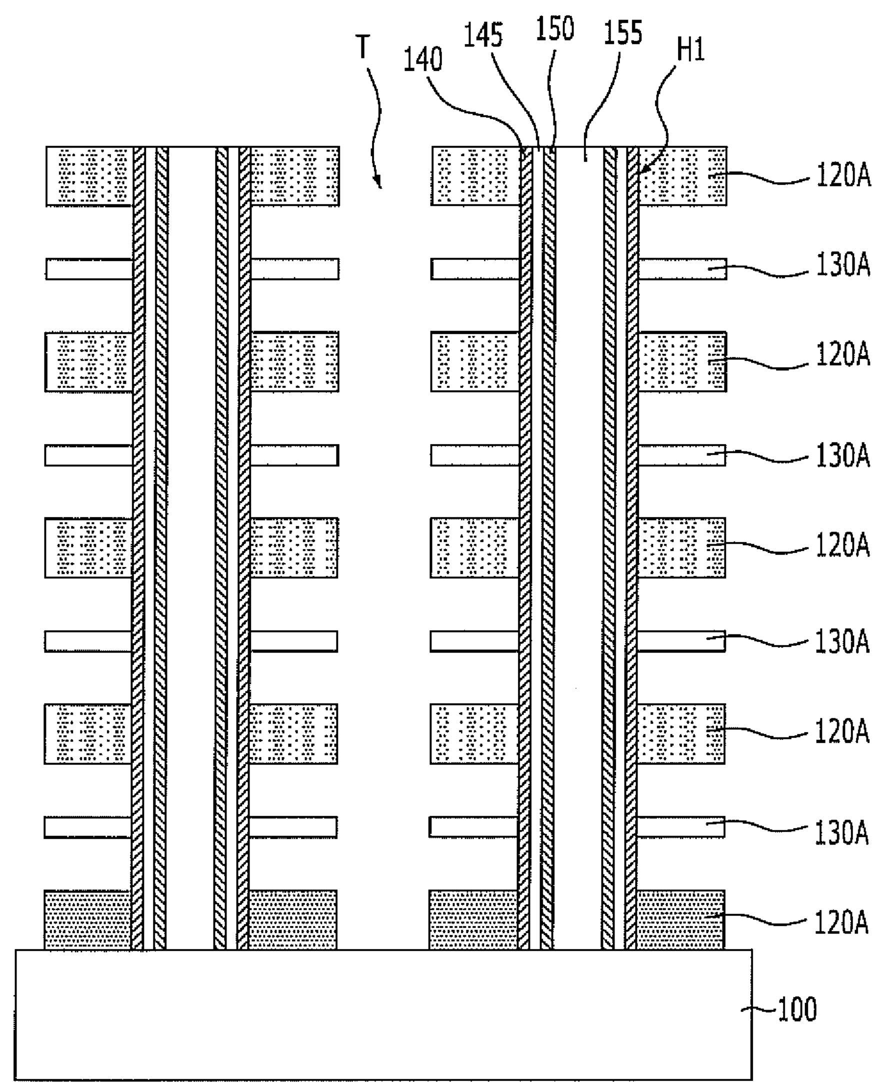
Figure 1D:
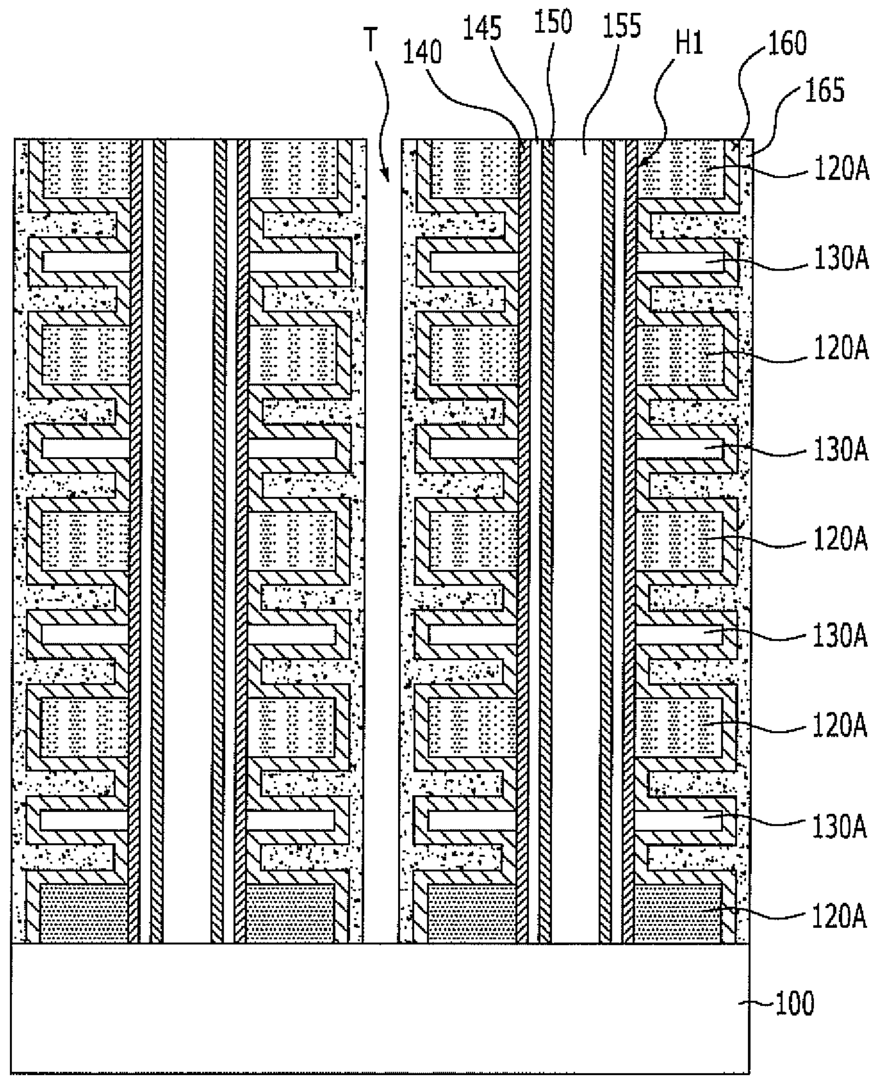
Figure 1E:
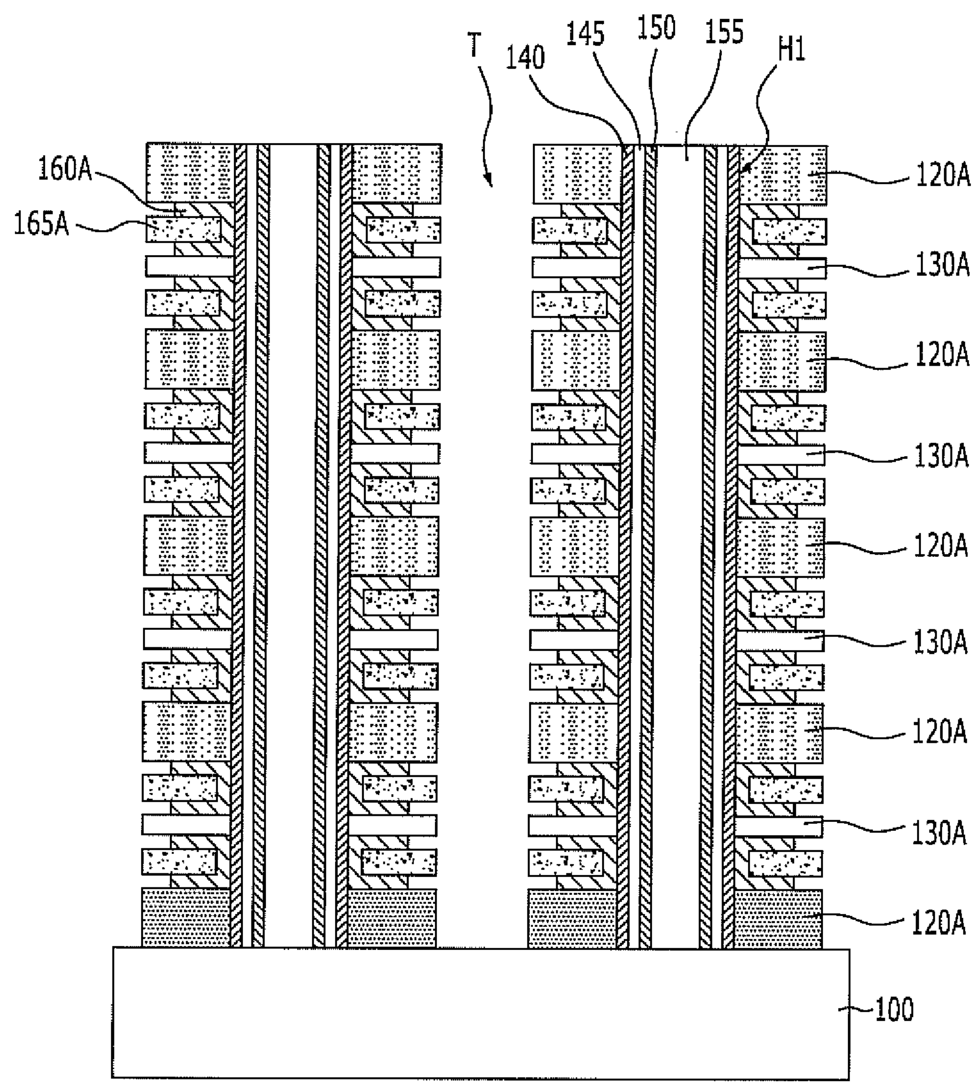
Figure 1F:
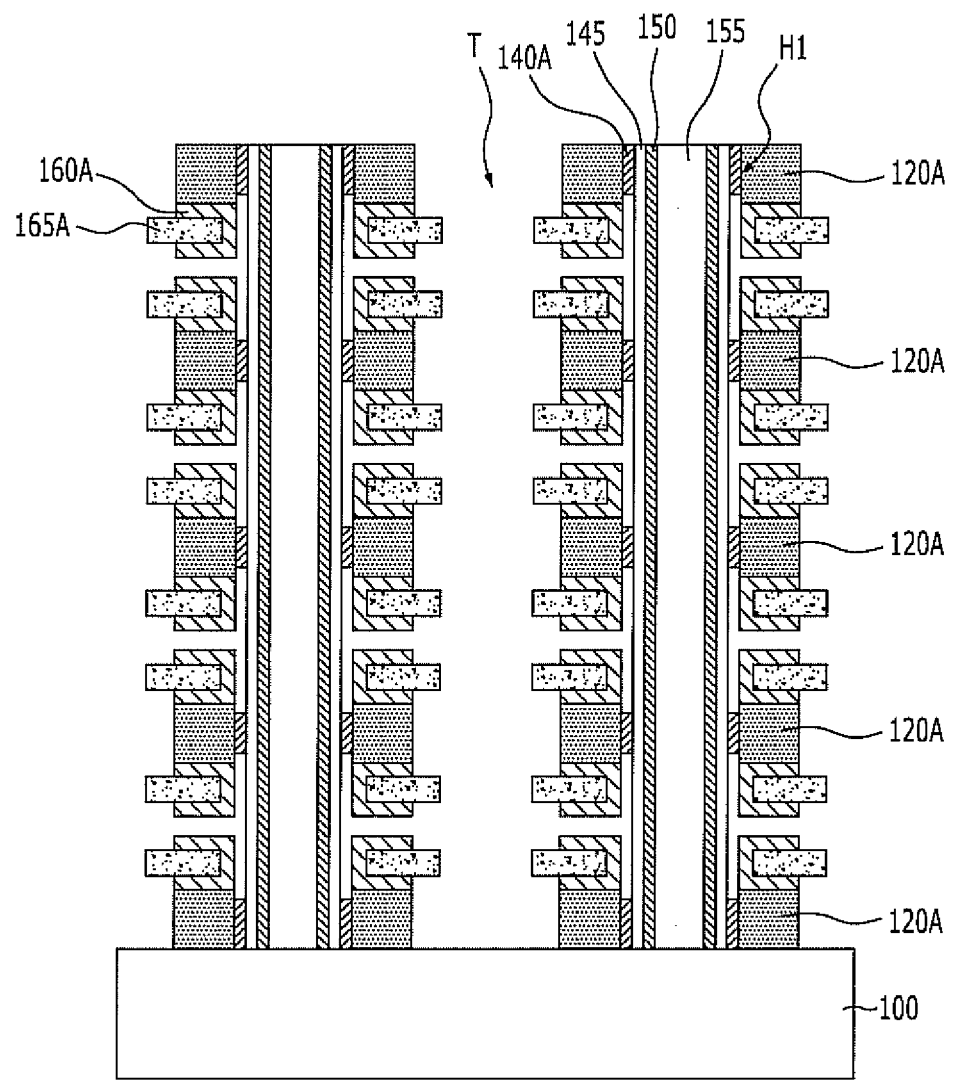
Figure 1G:
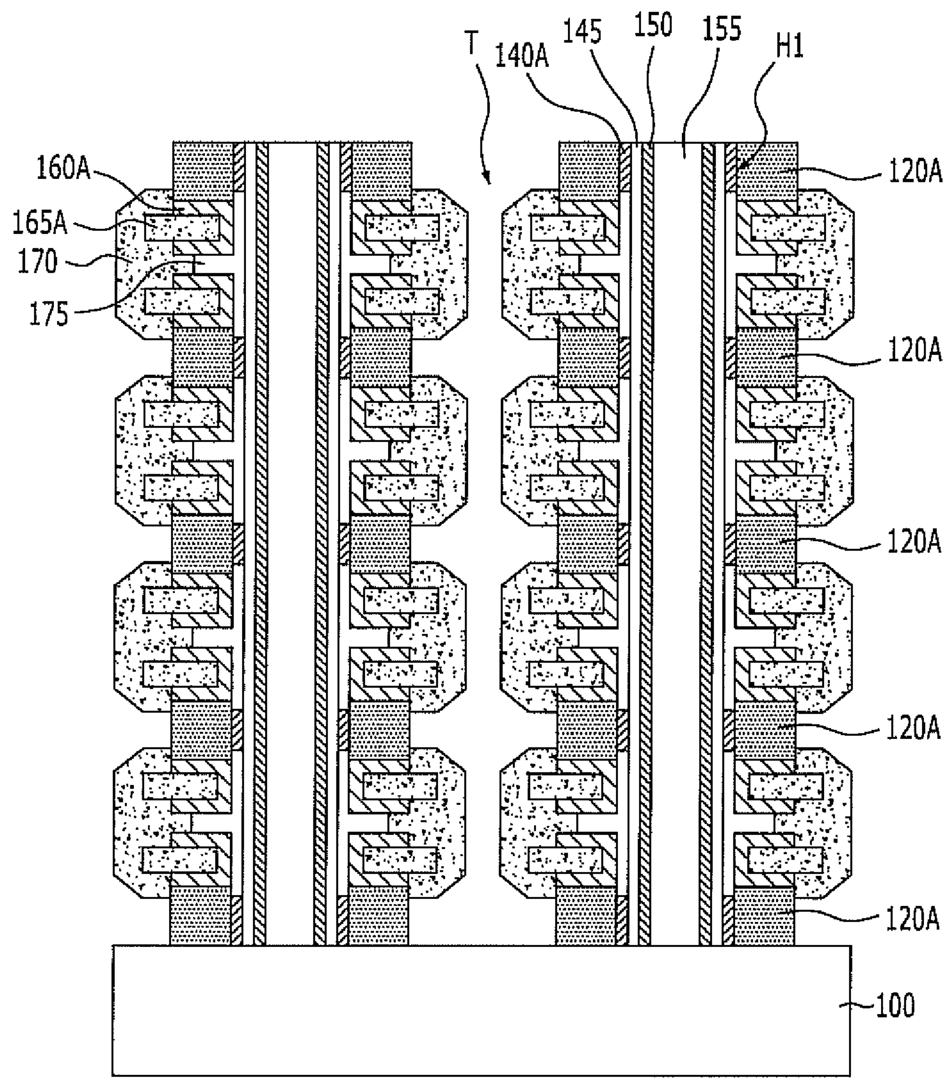

FIGS. 1A to 1G are cross-sectional views illustrating a non-volatile memory device and a fabrication method thereof in accordance with a first embodiment of the present invention. FIG. 1G is a cross-sectional view illustrating the non-volatile memory device in accordance with the first embodiment of the present invention. FIGS. 1A to 1F are cross-sectional view illustrating a process for fabricating the non-volatile memory device show in FIG. 1G.

Referring to FIG. 1A, an inter-layer dielectric layer 120, a first sacrificial layer 125, a second sacrificial layer 130, and a third sacrificial layer 135 are sequentially and repeatedly stacked over a substrate 100. The substrate 100 may be a semiconductor substrate such as a monocrystalline silicon substrate, and the substrate 100 may include an understructure (not shown). For illustration purposes, the structure where the inter-layer dielectric layer 120 and the first to third sacrificial layers 125, 130, and 135 are sequentially and repeatedly stacked is referred to as a gate structure.

The inter-layer dielectric layer 120 may be disposed in the lowermost portion and the uppermost portion of the gate structure. The inter-layer dielectric layer 120 may be formed of an oxide-based material such as silicon oxide ($SiO_2$). Although the drawings show that the first to third sacrificial layers 125, 130, and 135 are stacked four times, the present invention is not limited to four sets of the first to third sacrificial layers 125, 130, and 135, and the first to third sacrificial layers 125, 130, and 135 may be stacked more than four times or less than four times.

Particularly, the first sacrificial layer 125 and the third sacrificial layer 135 are removed in a subsequent process to provide a space where a first gate electrode layer is to be formed. The first sacrificial layer 125 and the third sacrificial layer 135 may be formed of a material having an etch selectivity against the second sacrificial layer 130 and the inter-layer dielectric layer 120. For example, the first sacrificial layer 125 and the third sacrificial layer 135 may be formed of a nitride. Also, the second sacrificial layer 130 is removed in a subsequent process to provide a path for forming an air gap, which is to be described later. The second sacrificial layer 130 may be formed of a material having an etch selectivity against the first sacrificial layer 125, the third sacrificial layer 135, and the inter-layer dielectric layer 120. For example, the first sacrificial layer 125 and the third sacrificial layer 135 may be formed of polysilicon.

Referring to FIG. 1B, channel holes H1 are formed to expose the substrate 100 by selectively etching the gate structure. The channel holes H1 may have a round or oval shape when seen from above, and a plurality of channel holes H1 may be arrayed in a matrix form.

Subsequently, a charge blocking layer 140, a charge storage layer 145, and a tunnel insulation layer 150 are sequentially formed along sidewalls of the channel holes H1. The charge blocking layer 140 prevents charges in the charge storage layer 145 from transferring to a layer outside of the charge storage layer 145. The charge blocking layer 140 may be formed of an oxide layer. The charge storage layer 145 stores data by trapping charges. The charge storage layer 145 may be formed of a nitride layer. The tunnel insulation layer 150 performs a charge tunneling, and it may be formed of an oxide layer.

Subsequently, a channel layer 155 is formed in the channel holes H1. The channel layer 155 may be formed of a semiconductor material, e.g., polysilicon. Although the channel layer 155 may be formed to completely fill the channel holes H1 in the embodiment of the present invention, the scope of the present invention is not limited a channel layer that completely fills the channel holes H1. According to another embodiment, the channel layer 155 may not be formed to completely fill with the channel layer 155.

Although not illustrated in the drawings, a protective layer having an etch selectivity against the first sacrificial layer 125, the second sacrificial layer 130, and the third sacrificial layer 135 may be formed over the gate structure including the channel layer 155 to prevent the charge storage layer 145 or the channel layer 155 from being lost in the course of a subsequent process that removes the first sacrificial layer 125, the second sacrificial layer 130, and the third sacrificial layer 135.

Referring to FIG. 1C, slit holes T formed through the inter-layer dielectric layer 120 and the first to third sacrificial layers 125, 130, and 135 are formed by selectively etching the gate structure on both sides of each channel hole H1. The slit holes T may be arrayed in parallel to each other in a form of slit extending in a direction crossing the cross-sectional direction of the drawings.

Subsequently, the first sacrificial layer 125 and the third sacrificial layer 135 that are exposed by the slit holes T are removed. A wet etch process using the etch selectivity against the inter-layer dielectric layer pattern 120A and the second sacrificial layer pattern 130A may be performed to remove the first sacrificial layer 125 and the third sacrificial layer 135. The inter-layer dielectric layer 120 and the second sacrificial layer 130 that are not etched or removed are referred to as an inter-layer dielectric layer pattern 120A and a second sacrificial layer pattern 130A, respectively. Meanwhile, the under-structure of the substrate 100 may be protected from being damaged in the process of removing the second sacrificial layer pattern 130A by implanting an impurity, such as boron (B), into the substrate 100 exposed through the slit holes T to give the exposed substrate 100 an etch selectivity against the second sacrificial layer pattern 130A.

Referring to FIG. 1D, a barrier metal layer 160 is formed along walls a resultant structured formed by removing the first sacrificial layer 125 and the third sacrificial layer 135. The barrier metal layer 160 improves interface characteristics between a first gate electrode layer, which is to be described later, and the inter-layer dielectric layer pattern 120A, the second sacrificial layer pattern 130A, and the charge blocking layer 140. For example, the barrier metal layer 160 may be formed by conformally depositing a titanium nitride (TiN).

Subsequently, a conductive layer 165 for forming a first gate electrode, which is referred to as a first gate electrode-forming conductive layer 165, is formed over the barrier metal layer 160 to fill a space created by removing the first sacrificial layer 125 and the third sacrificial layer 135. The first gate electrode-forming conductive layer 165 may be formed by depositing a conductive material, such as metal, through an Atomic Layer Deposition (ALD) process or a Chemical Vapor Deposition (CVD) process. For example, the first gate electrode-forming conductive layer 165 may be formed by forming a tungsten (W) core first and subsequently depositing a bulk tungsten.

Referring to FIG. 1E, the first gate electrode-forming conductive layer 165 and the barrier metal layer 160 are etched until the sides of the second sacrificial layer pattern 130A and the inter-layer dielectric layer pattern 120A are exposed to isolate the barrier metal layer 160 and the first gate electrode-forming conductive layer 165 for each layer.

It is desirable to minimize the volume of the barrier metal layer 160, which has a relatively high resistance value, and the barrier metal layer 160 may be etched deeper than the first gate electrode-forming conductive layer 165 as a result of the etch rate difference between the barrier metal layer 160 and the first gate electrode-forming conductive layer 165. The barrier metal layer 160 and the first gate electrode-forming conductive layer 165 that are not etched between the inter-layer dielectric layer pattern 120A and the second sacrificial layer pattern 130A are referred to as a barrier metal layer pattern 160A and a first gate electrode layer 165A, respectively.

Referring to FIG. 1F, the charge blocking layer 140 is exposed by removing the second sacrificial layer pattern 130A. The second sacrificial layer pattern 130A may be removed through a wet etch process using the etch selectivity against the inter-layer dielectric layer pattern 120A, the barrier metal layer pattern 160A, and the first gate electrode layer 165A.

Subsequently, a portion of the exposed charge blocking layer 140 is removed. The removed portion of the charge blocking layer 140 may be the portion of the charge blocking layer 140 that contacts the barrier metal layer pattern 160A, and the charge blocking layer 140 that is not removed is referred to as a charge blocking layer pattern 140A. The portion of the charge blocking layer 140 may be removed through a wet etch process that is performed using the etch selectivity against the barrier metal layer pattern 160A and the first gate electrode layer 165A. Since a portion of the inter-layer dielectric layer pattern 120A is removed and recessed during the wet etch process, the first gate electrode layer 165A may extend further into the slit holes T than the inter-layer dielectric layer pattern 120A.

Referring to FIG. 1G, a second gate electrode layer 170 that covers an air gap 175, which is formed by removing the second sacrificial layer pattern 130A and the portion of the charge blocking layer 140, is formed. The second gate electrode layer 170 couples a pair of adjacent first gate electrode layers 165A, and the second gate electrode layer 170 may extend into the slit hole T from the inter-layer dielectric layer pattern 120A. As a result of this process, a gate electrode formed of the first gate electrode layer 165A and the second gate electrode layer 170 is formed.

The second gate electrode layer 170 may include a metal. For example, the second gate electrode layer 170 may be formed by selectively depositing a bulk tungsten without a nucleation tungsten. More specifically, when the first gate electrode layer 165A is formed of tungsten and the second gate electrode layer 170 is formed by depositing a bulk tungsten through a selective deposition process, the tungsten is deposited on the existing tungsten layer, which is the first gate electrode layer 165A. Therefore, mask process and a gate electrode isolation process may not be further performed.

Also, when the second gate electrode layer 170 is formed through the selective deposition process, an electrical bridge may be prevented from occurring between the second gate electrode layers 170. Also, since the influence of a loading effect is minimized, tungsten may be uniformly deposited to the edge of a memory cell.

The non-volatile memory device in accordance with the first embodiment of the present invention may be fabricated through the fabrication method described above.

Referring to FIG. 1G, the non-volatile memory device in accordance with the first embodiment of the present invention includes the channel layer 155 that is extends vertically from the substrate 100, the multiple inter-layer dielectric layer patterns 120A and the multiple gate electrodes that are alternately stacked along the channel layer 155, the charge storage layer 145 interposed between the channel layer 155 and each gate electrode, the air gap 175 interposed between the gate electrode and the charge storage layer 145, the tunnel insulation layer 150 interposed between the charge storage layer 145 and the channel layer 155, and the barrier metal layer pattern 160A interposed between the inter-layer dielectric layer pattern 120A and the gate electrode.

Each of the gate electrodes may be formed of the first gate electrode layer 165A and the second gate electrode layer 170 that is coupled with the first gate electrode layer 165A. Particularly, the gate electrode extends in one direction while surrounding the channel layer 155, and the gate electrode may have a portion extending into the slit hole T from the inter-layer dielectric layer pattern 120A.

FIGS. 2A to 2I are cross-sectional views illustrating a non-volatile memory device and a fabrication method thereof in accordance with a second embodiment of the present invention. While describing the second embodiment of the present invention, description of portions that are substantially the same as the first embodiment is omitted.

Figure 2A:
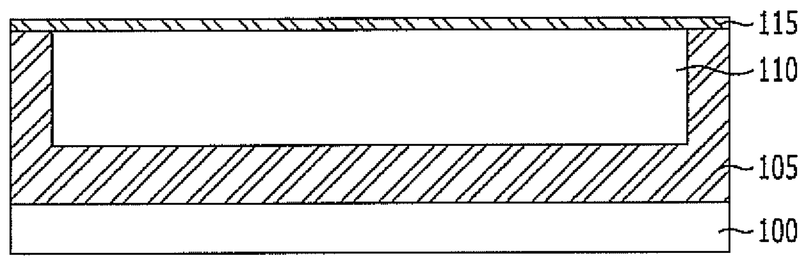
FIGS. 2A to 2I are cross-sectional views illustrating a non-volatile memory device and a fabrication method thereof in accordance with a second embodiment of the present invention.

Referring to FIG. 2A, a first pass gate electrode layer 105 is formed over a substrate 100. The substrate 100 may be a semiconductor substrate such as a monocrystalline silicon substrate, and the first pass gate electrode layer 105 may be formed of a conductive material, such as doped polysilicon or metal.

Subsequently, the first pass gate electrode layer 105 is selectively etched to form a groove, and a sacrificial layer pattern 110 is formed in the groove.

The sacrificial layer pattern 110 is removed in a subsequent process to provide a space where sub-channel holes are to be formed. The sacrificial layer pattern 110 may be formed of a material having an etch selectivity against the first pass gate electrode layer 105, a second pass gate electrode layer 115, and a gate structure. Also, the sacrificial layer pattern 110 is arrayed in a matrix form when seen from above, and the sacrificial layer pattern 110 may have a shape of island having a longitudinal axis in the cross-sectional direction shown in the drawing and a short axis of a direction crossing the cross-sectional direction shown in the drawing.

Subsequently, a second pass gate electrode layer 115 is formed over the first pass gate electrode layer 105 and the sacrificial layer pattern 110. The second pass gate electrode layer 115 may be formed of a conductive material, such as a doped polysilicon or metal. The first pass gate electrode layer 105 and the second pass gate electrode layer 115 are gate electrodes of a pass transistor and may have a shape surrounding the sacrificial layer pattern 110.

Figure 2B:
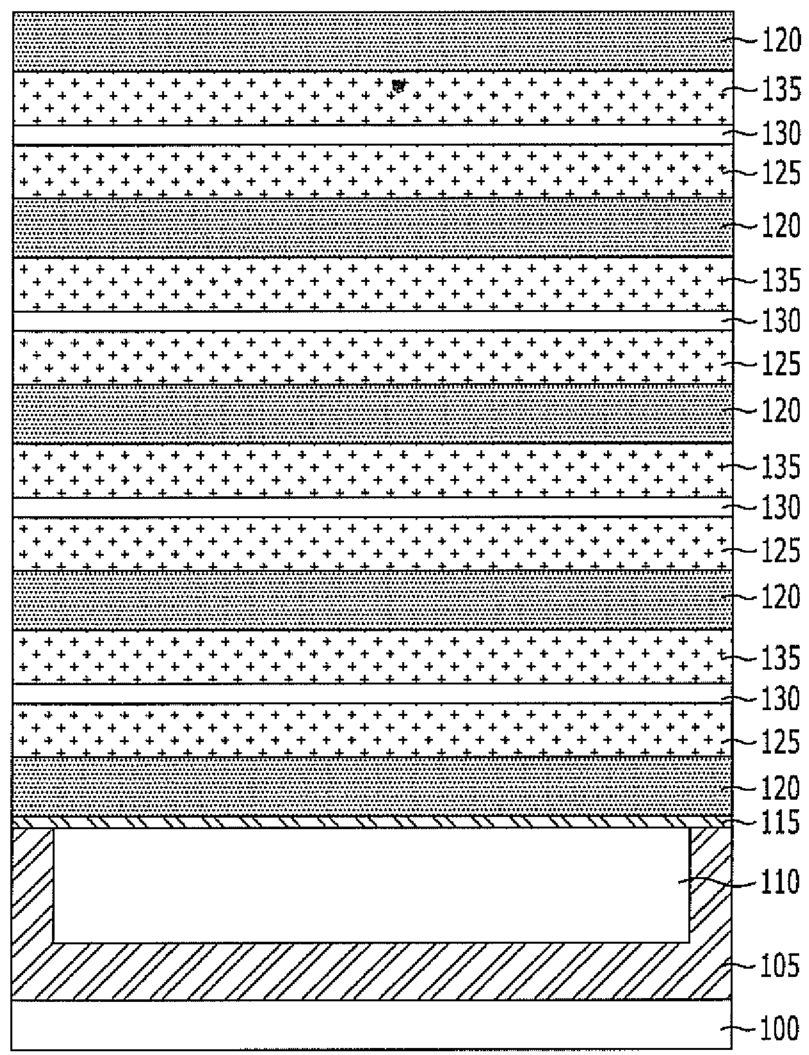

Referring to FIG. 2B, an inter-layer dielectric layer 120, a first sacrificial layer 125, a second sacrificial layer 130, and a third sacrificial layer 135 are sequentially and repeatedly stacked over the second pass gate electrode layer 115. The inter-layer dielectric layer 120 may be formed of an oxide-based material, The first sacrificial layer 125 and the third sacrificial layer 135 are removed in a subsequent process to provide a space where a first gate electrode layer is to be formed. The first sacrificial layer 125 and the third sacrificial layer 135 may be formed of a material having an etch selectivity against the second sacrificial layer 130 and the inter-layer dielectric layer 120. Also, the second sacrificial layer 130 is a layer used to form an air gap, which is to be described later, and the second sacrificial layer 130 may be formed of a material having an etch selectivity against the first sacrificial layer 125, the third sacrificial layer 135, and the inter-layer dielectric layer 120.

Figure 2C:
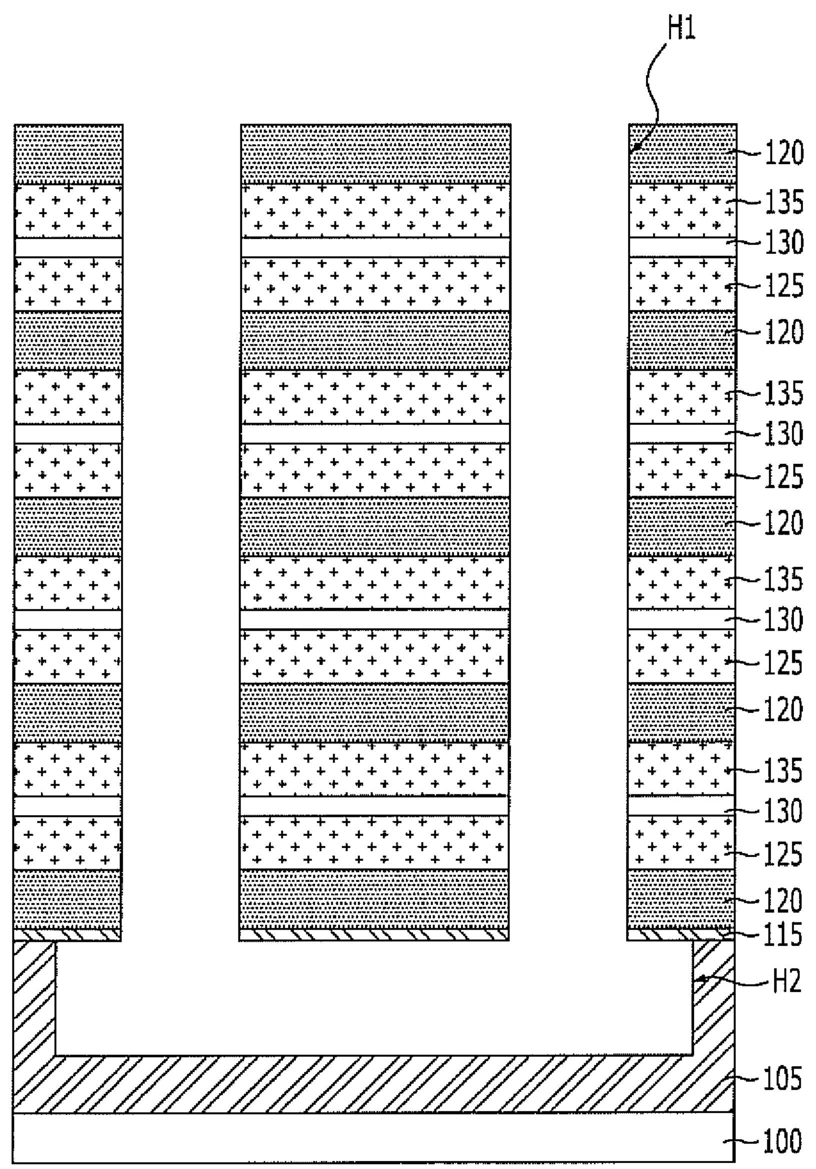

Referring to FIG. 2C, a pair of channel holes H1 that exposes the sacrificial layer pattern 110 is formed by selectively etching the gate structure and the second pass gate electrode layer 115. The pair of the channel holes H1 provides a space for forming a channel layer, which is to be described later, and a pair of channel holes H1 may be disposed for each sacrificial layer pattern 110.

Subsequently, the sacrificial layer pattern 110 exposed through the pair of the channel holes H1 is removed. The sacrificial layer pattern 110 may be removed through a wet etch process, which is performed using the etch selectivity against the first pass gate electrode layer 105, the second pass gate electrode layer 115, and the gate structure. As a result of this process, sub-channel holes H2 for coupling the pair of the channel holes H1 are formed in the space created by removing the sacrificial layer pattern 110.

Figure 2D:
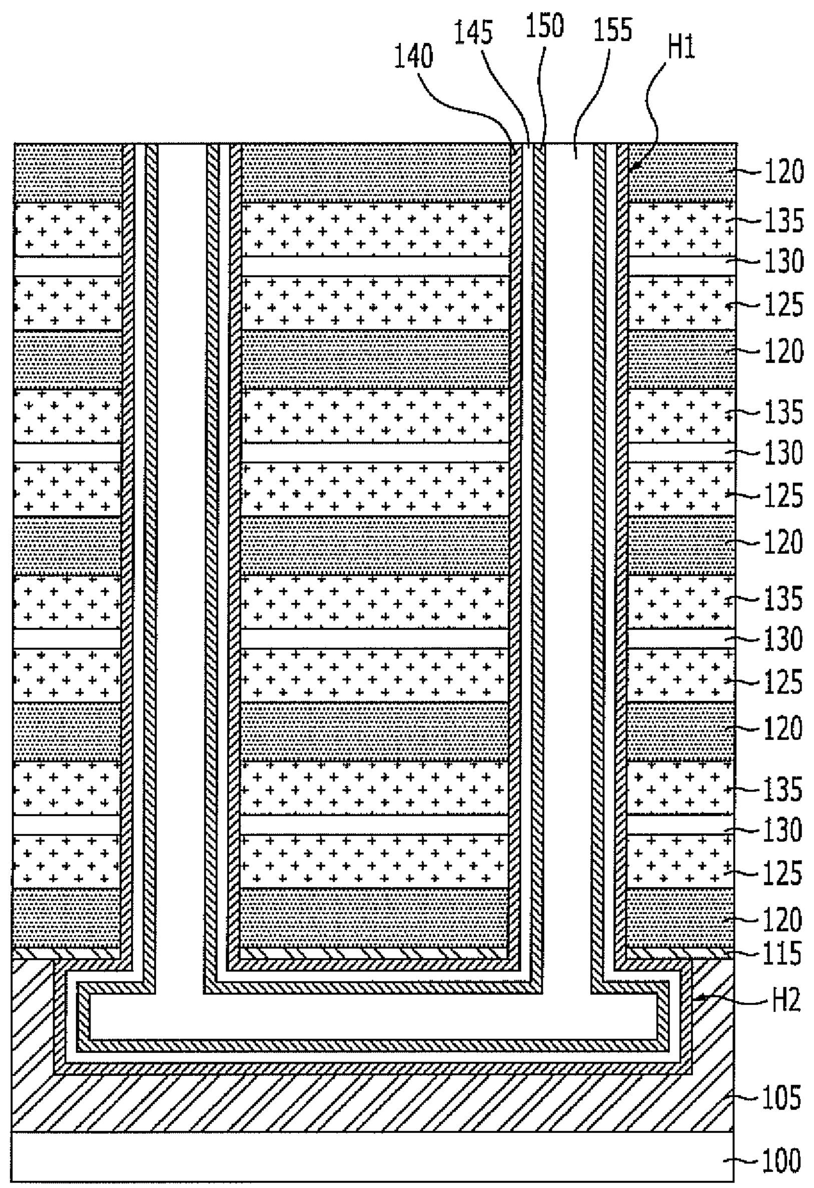

Referring to FIG. 2D, a charge blocking layer 140, a charge storage layer 145, and a tunnel insulation layer 150 are sequentially formed along internal walls of the pair of the channel holes H1 and the sub-channel holes H2. The charge blocking layer 140, the charge storage layer 145, and the tunnel insulation layer 150 are sequentially formed. The charge blocking layer 140, the charge storage layer 145, and the tunnel insulation layer 150 may have a triple-layer structure of oxide-nitride-oxide (ONO).

Subsequently, a channel layer 155 is formed in the pair of the channel holes H1 and the sub-channel holes H2. The channel layer 155 may be divided into a main channel layer that is used as a channel for a selection transistor or a memory cell and a sub-channel layer that is used as a channel for a pass transistor. The channel layer 155 may be formed of a semiconductor material, such as polysilicon.

Figure 2E:
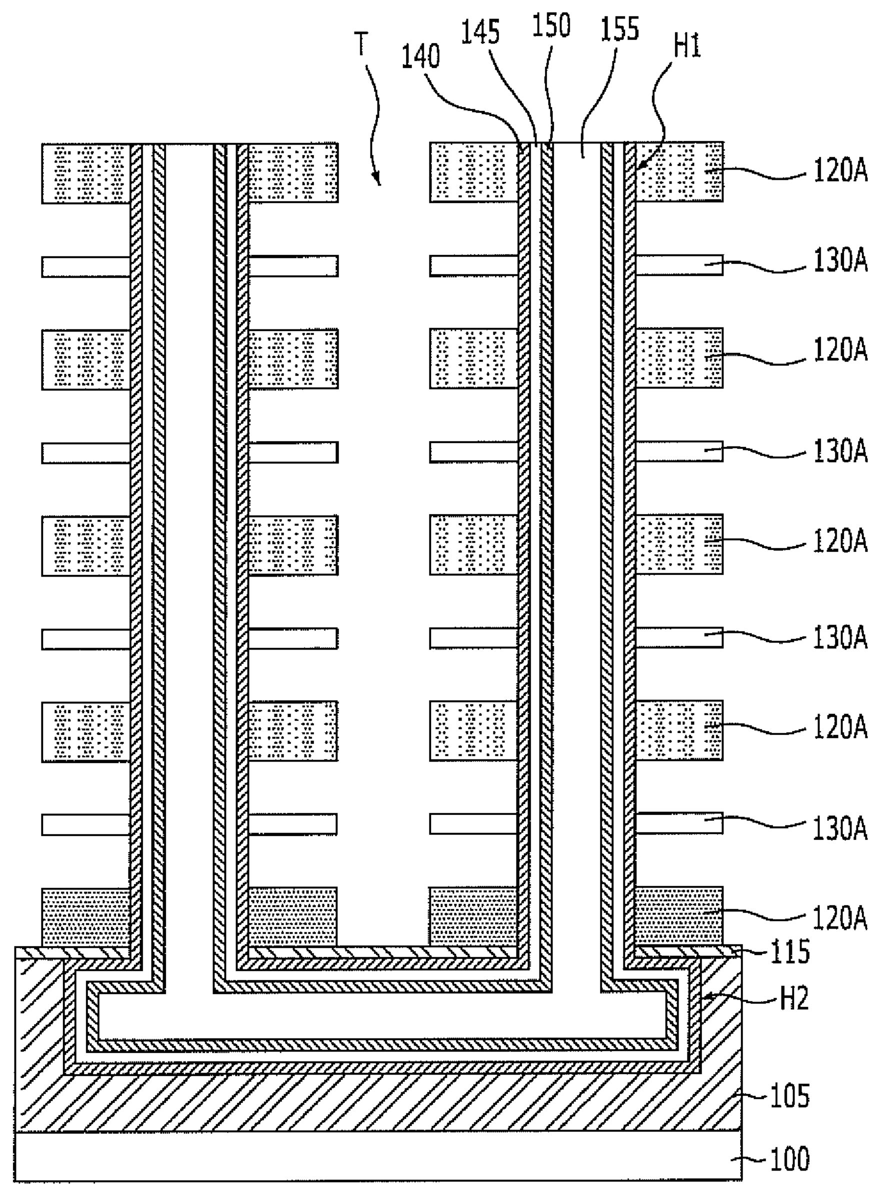

Referring to FIG. 2E, slit holes T formed through the inter-layer dielectric layer 120 and the first to third sacrificial layers 125, 130 and 135 are formed by selectively etching the gate structure on both sides of each channel hole H1. The slit holes T may be arrayed in parallel to each other in a form of slit extending in a direction crossing the cross-sectional direction of the drawings.

Subsequently, the first sacrificial layer 125 and the third sacrificial layer 135 that are exposed by the slit holes T are removed. A wet etch process using the etch selectivity against the inter-layer dielectric layer pattern 120A and the second sacrificial layer pattern 130A may be performed to remove the first sacrificial layer 125 and the third sacrificial layer 135. The inter-layer dielectric layer 120 and the second sacrificial layer 130 that are not etched or removed are referred to as an inter-layer dielectric layer pattern 120A and a second sacrificial layer pattern 130A, respectively.

Figure 2F:
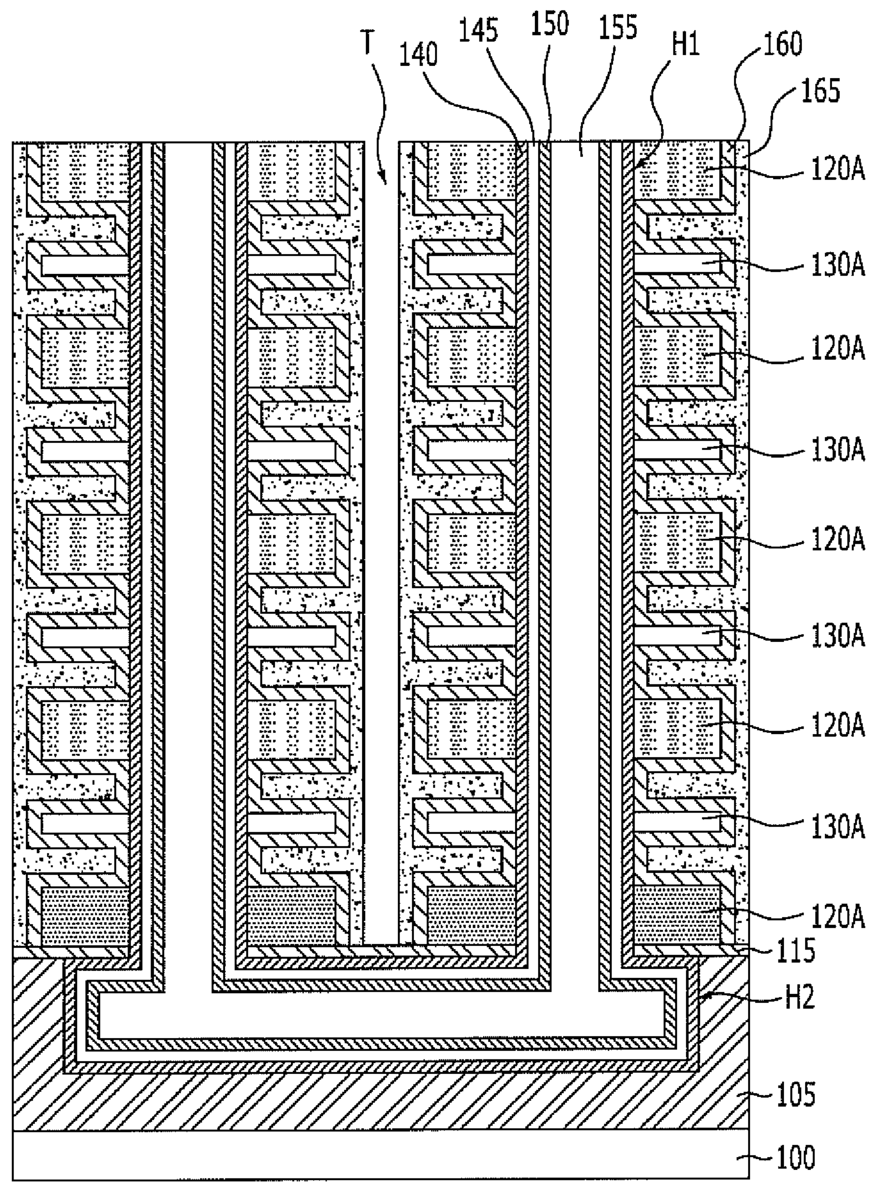

Referring to FIG. 2F, a barrier metal layer 160 is formed a resultant structure formed by removing first sacrificial layer 125 and the third sacrificial layer 135. The barrier metal layer 160 improves interface characteristics. For example, the barrier metal layer 160 may be formed by conformally depositing a titanium nitride (TiN).

Subsequently, a conductive layer 165 for forming a first gate electrode, which is referred to as a first gate electrode-forming conductive layer 165, is formed over the barrier metal layer 160 to fill a space created by removing the first sacrificial layer 125 and the third sacrificial layer 135. The first gate electrode-forming conductive layer 165 may be formed by depositing a conductive material, such as metal, through an Atomic Layer Deposition (ALD) process or a Chemical Vapor Deposition (CVD) process.

Figure 2G:
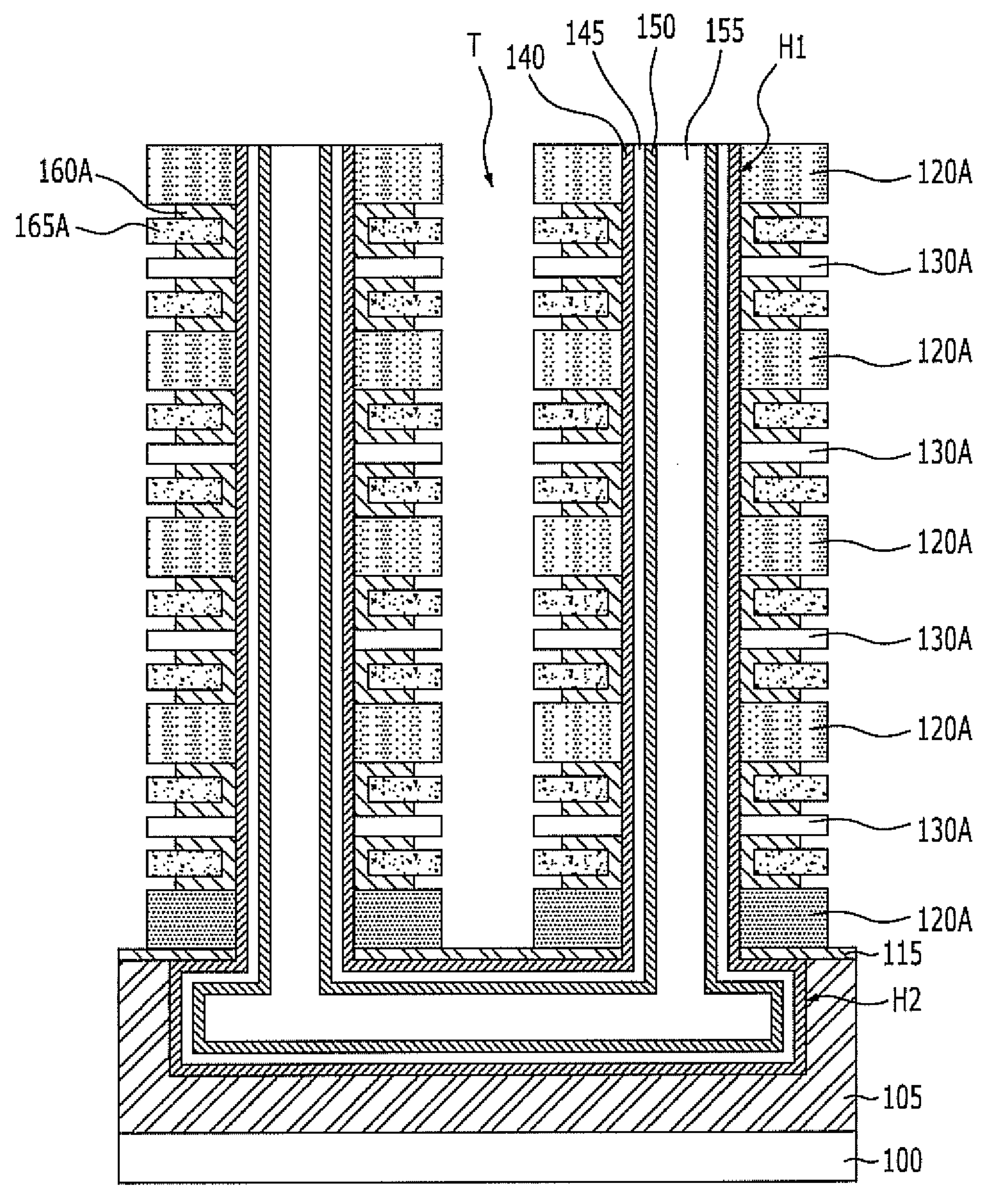

Referring to FIG. 2G, the first gate electrode-forming conductive layer 165 and the barrier metal layer 160 are etched until the sides of the second sacrificial layer pattern 130A and the inter-layer dielectric layer pattern 120A are exposed to isolate the barrier metal layer 160 and the first gate electrode-forming conductive layer 165 for each layer.

The remaining barrier metal layer 160 and the remaining first gate electrode-forming conductive layer 165 that are not etched between the inter-layer dielectric layer pattern 120A and the second sacrificial layer pattern 130A are referred to as a barrier metal layer pattern 160A and a first gate electrode layer 165A, respectively.

Figure 2H:
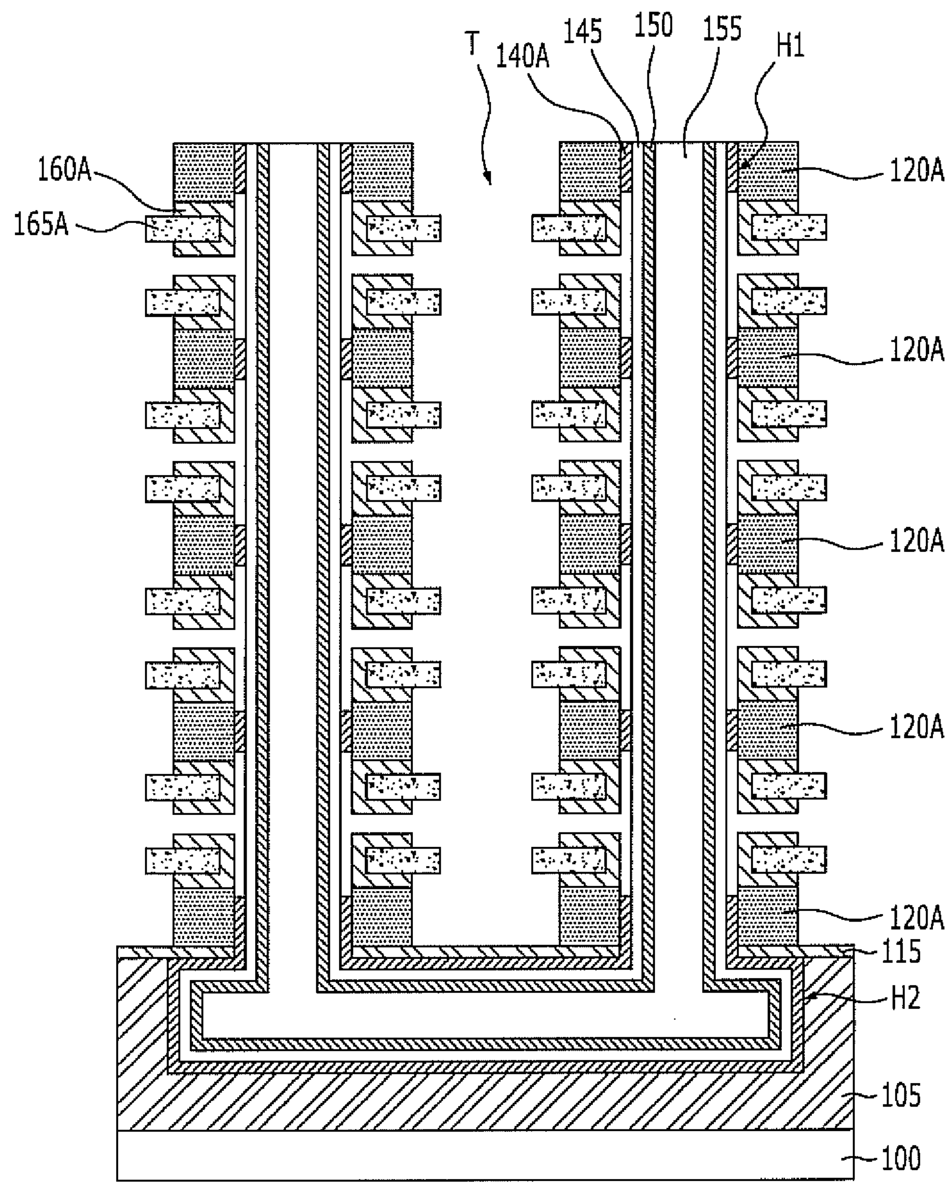

Referring to FIG. 2H, the charge blocking layer 140 is exposed by removing the second sacrificial layer pattern 130A. The second sacrificial layer pattern 130A may be removed through a wet etch process that is performed using the etch selectivity against the inter-layer dielectric layer pattern 120A, the barrier metal layer pattern 160A, and the first gate electrode layer 165A.

Subsequently, a portion of the exposed charge blocking layer 140 is removed. The removed portion of the charge blocking layer 140 may be the portion of the charge blocking layer 140 that contacts the barrier metal layer pattern 160A, and the charge blocking layer 140 that is not removed is referred to as a charge blocking layer pattern 140A. The portion of the charge blocking layer 140 may be removed through a wet etch process that is performed using the etch selectivity against the barrier metal layer pattern 160A and the first gate electrode layer 165A.

Figure 2I:
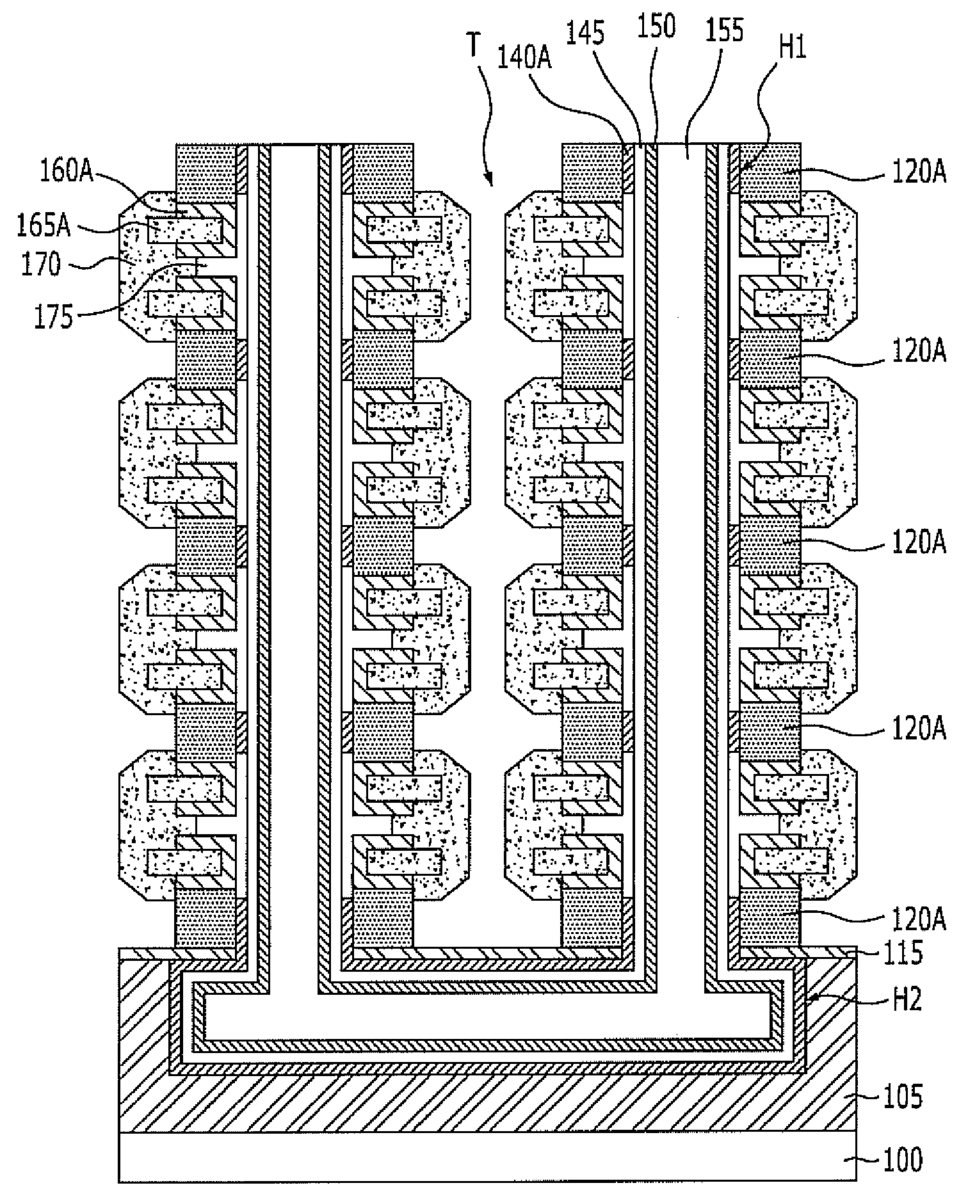

Referring to FIG. 2I, a second gate electrode layer 170 that covers an air gap 175, which is formed by removing the second sacrificial layer pattern 130A and the portion of the charge blocking layer 140, is formed. As a result of this process, a gate electrode formed of the first gate electrode layer 165A and the second gate electrode layer 170 is formed.

The second gate electrode layer 170 may be formed by selectively depositing a conductive material such as metal. The second gate electrode layer 170 couples a pair of adjacent first gate electrode layers 165A, and the second gate electrode layer 170 may extend into the slit hole T from the inter-layer dielectric layer pattern 120A.

In the second embodiment of the present invention, a pass gate electrode that includes the first pass gate electrode layer 105 and the second pass gate electrode layer 115 is formed in the lower portion of the gate structure, and the pass gate electrode includes a sub-channel layer for coupling a pair of main channel layers with each other.

According to an embodiment of the present invention, erase operation characteristics may be improved by suppressing back tunneling of electrons by substituting a charge blocking layer interposed between a gate electrode and a charge storage layer with an air gap, and a method for fabricating the non-volatile memory device.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a non-volatile memory device, comprising:

alternately stacking a plurality of inter-layer dielectric layers and a plurality of first and second sacrificial layers over a substrate;

forming channel holes that expose the substrate by selectively etching the inter-layer dielectric layers and the first and second sacrificial layers;

sequentially forming a charge blocking layer, a charge storage layer, a tunnel insulation layer, and a channel layer along internal walls of the channel holes;

forming slit holes through the first and second sacrificial layers and the inter-layer dielectric layers on both sides of each channel hole;

removing the first sacrificial layers exposed through the slit holes;

forming a first gate electrode layer pattern in a space created by removing the first sacrificial layers;

removing the second sacrificial layers; and forming a second gate electrode layer for coupling a pair of the first gate electrode layer patterns with each other with an air gap formed between the pair of first gate electrode layer patterns, wherein the air gap is formed by removing the second sacrificial layers.

2. The method of claim 1, further comprising:

forming a barrier metal layer on internal walls of removed resultant structure formed by removing the first sacrificial layers, before the forming of the first gate electrode layer pattern.

3. The method of claim 1, further comprising:

removing a portion of the charge blocking layer that is exposed through the air gap, before the forming of the second gate electrode layer.

4. The method of claim 1, further comprising:

forming a pass gate electrode over the substrate, before the stacking of the inter-layer dielectric layers and the first and second sacrificial layers.

5. The method of claim 4, further comprising:

forming sub-channel holes that each couples a pair of channel holes with each other in the pass gate electrode, after the forming of the channel holes.

6. The method of claim 1, wherein the second gate electrode layer extends from each inter-layer dielectric layer into the slit hole.

7. The method of claim 1, wherein the second gate electrode layer is formed by selectively depositing tungsten.

8. The method of claim 1, wherein the second sacrificial layer is formed of a material having an etch selectivity against the first sacrificial layer.

* * * * *